(12) United States Patent
Kao

(10) Patent No.: US 6,816,013 B2
(45) Date of Patent: Nov. 9, 2004

(54) AUTOMATIC GAIN CONTROL DEVICE

(75) Inventor: Hsueh-Wu Kao, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 0 days.

(21) Appl. No.: 10/614,869

(22) Filed: Jul. 9, 2003

(65) Prior Publication Data

US 2004/0017254 A1 Jan. 29, 2004

(30) Foreign Application Priority Data

Jul. 25, 2002 (TW) ...................................... 091116677 A

(51) Int. Cl.[7] .............................. H03G 3/10; H04B 1/06
(52) U.S. Cl. ..................... 330/279; 330/134; 455/234.1
(58) Field of Search ................................. 330/129, 134, 330/279; 455/232.1, 234.1

(56) References Cited

U.S. PATENT DOCUMENTS 5,917,372 A * 6/1999 Kakura et al. .............. 330/279
6,289,044 B1 * 9/2001 Velez et al. ............... 455/234.1
6,297,698 B1 * 10/2001 Callahan, Jr. ................ 330/254

* cited by examiner

Primary Examiner—Khanh Van Nguyen
(74) Attorney, Agent, or Firm—Birch, Stewart, Kolasch & Birch, LLP

(57) ABSTRACT

An automatic gain control device without being influenced by leakage current of a capacitor. The automatic gain control device includes a first control loop, a second control loop, and a multiplexer. The first control loop receives an input voltage and generates a first AGC voltage accordingly. The second control loop receives the first AGC voltage, registers the first AGC voltage as digital data, and outputs a second AGC voltage by a DAC. The multiplexer chooses the first AGC voltage or the second AGC voltage as an AGC voltage according to a hold signal. Because the second control loop registers the first AGC voltage in a digital format and output the second AGC voltage from the DAC, the AGC voltage can be held constant for a long time without being influenced by leakage current.

7 Claims, 4 Drawing Sheets

AUTOMATIC GAIN CONTROL DEVICE

BACKGROUND OF THE INVENTION

1. Field of the Invention

The invention relates to an automatic gain control (AGC) device, and more particularly to an AGC device without being influenced by leakage current.

2. Description of the Related Art

An automatic gain control (AGC) device generates an output signal with desired amplitude by providing a properly stable gain control voltage for input signals with different amplitudes. Referring to FIG. 1, a conventional AGC device 10 includes a variable gain amplifier (VGA) 11, a top detector 12, a bottom detector 13, a substractor 14, a target setting unit 15, a comparator 16, a charge pump 17, and a capacitor 18. The control device 10 outputs an output signal Vo from the VGA 11, which gain is controlled by the gain control voltage Vg. The top detector 12 and the bottom detector 13 detect a top voltage Vt and a bottom voltage Vb of the output signal Vo. The substractor 14 calculates a voltage difference Vd between the top voltage Vt and the bottom voltage Vb, wherein the voltage difference Vd is a peak-to-peak amplitude of the output signal Vo. Thereafter, the comparator 16 compares the voltage difference Vd with a target value Vs and then generates a comparison value which control the charge pump 17 to generate a gain control voltage Vg and holds the voltage by the capacitor 18. The operation principle is described in the following. When the comparison value is HIGH, the voltage difference Vd is smaller than the target value Vs. At this time, the charge pump 17 charges the capacitor 18 to increase the gain control voltage Vg. In this case, the gain of the VGA 11 increases, the voltage of the output signal Vo is increased, and the voltage difference Vd also is increased accordingly. The operation of the loop lasts until the voltage difference Vd equals to the target value Vs. On the contrary, if the voltage difference Vd is greater than the target value Vs, the charge pump 17 discharges the capacitor 18 to reduce the gain control voltage Vg. Therefore, the gain of the VGA 11 is dropped to decrease the voltage of the output signal Vo, and the voltage difference Vd is also decreased. The operation of the loop lasts until the voltage difference Vd equals to the target value Vs.

The control device 10 utilizes the charge pump 17 to constitute a closed loop and build a optimum gain control voltage on the capacitor 18 to set an optimum gain control. In some occasions (e.g., in a long-time seeking of an optical storage system), the input signal's amplitude to the VGA 11 is un-regular, then, the loop has to be disabled and the gain control voltage Vg then has to be held for a period of time in order to avoid error operations of the AGC device. In this case, the AGC voltage may be dropped due to the leakage current of the capacitor 18, and the held gain may be changed to cause errors in system operations.

SUMMARY OF THE INVENTION

In view of the above-mentioned problems, an object of the invention is to provide an AGC device, which is free from being influenced by leakage current and capable of holding the gain control voltage for a long time.

To achieve the above-mentioned object, the invention provides an AGC device including a first control loop, a second control loop, and a multiplexer. The first control loop receives an input signal and generates a first AGC voltage accordingly. The second control loop receives the first AGC voltage, registers the first AGC voltage in a digital format, and outputs a second AGC voltage. The multiplexer chooses the first AGC voltage or the second AGC voltage as an AGC voltage according to a holding signal.

The second control loop includes a second comparator, an up/down counter, a digital-to-analog converter (DAC), a hold control unit, and a counting signal generator. The second comparator has a positive terminal for receiving the first AGC voltage and a negative terminal for receiving the second AGC voltage, and outputs a comparison signal. The up/down counter receives a comparison signal as an up/down counting control signal, up-counts when the comparator outputs HIGH, down-counts when the comparator outputs LOW, receives a counting signal as a counting trigger signal for counting, and outputs a count value accordingly. The DAC converts digital data of the count value into the second AGC voltage. The hold control unit generates the hold signal according to a hold command. The counting signal generator receives the hold signal, stops generating the counting signal to hold the result of the counter when the hold signal is LOW and enabled, and restores the counting signal to make the counter count normally when the hold signal is disabled.

Since the second control loop registers the first AGC voltage value in a digital format, only the second AGC voltage has to be output when the AGC voltage has to be held.

DETAILED DESCRIPTION OF THE INVENTION

The AGC device of the invention will be described with reference to the accompanying drawings.

Since the gain control voltage is held by a capacitor in a typical AGC device, the held gain control voltage may drop owing to the leakage current of the capacitor in the application of holding for a long time. Consequently, the invention proposes an AGC device utilizing a second loop circuit to register digitized voltage values so as to hold the gain control voltage and keep it unchanged for a long time.

Figure 2:
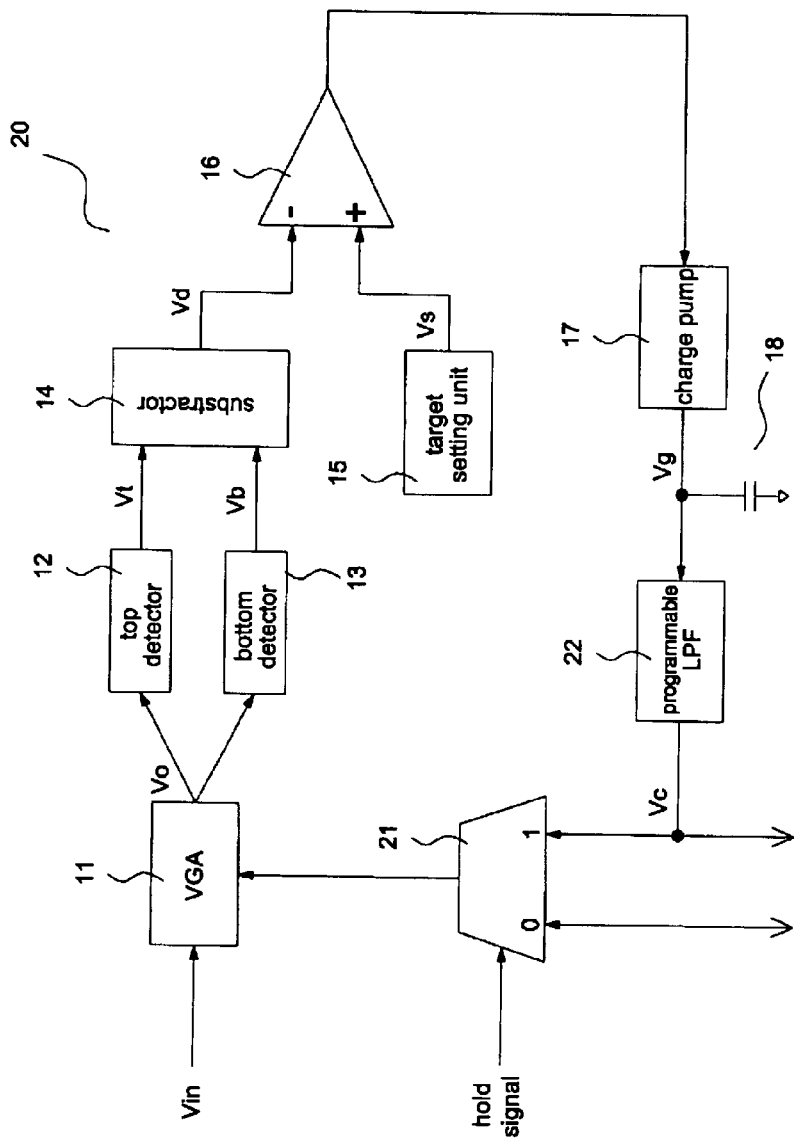
FIG. 2 shows a block diagram of a first loop of the AGC device of the present invention.
Figure 3:
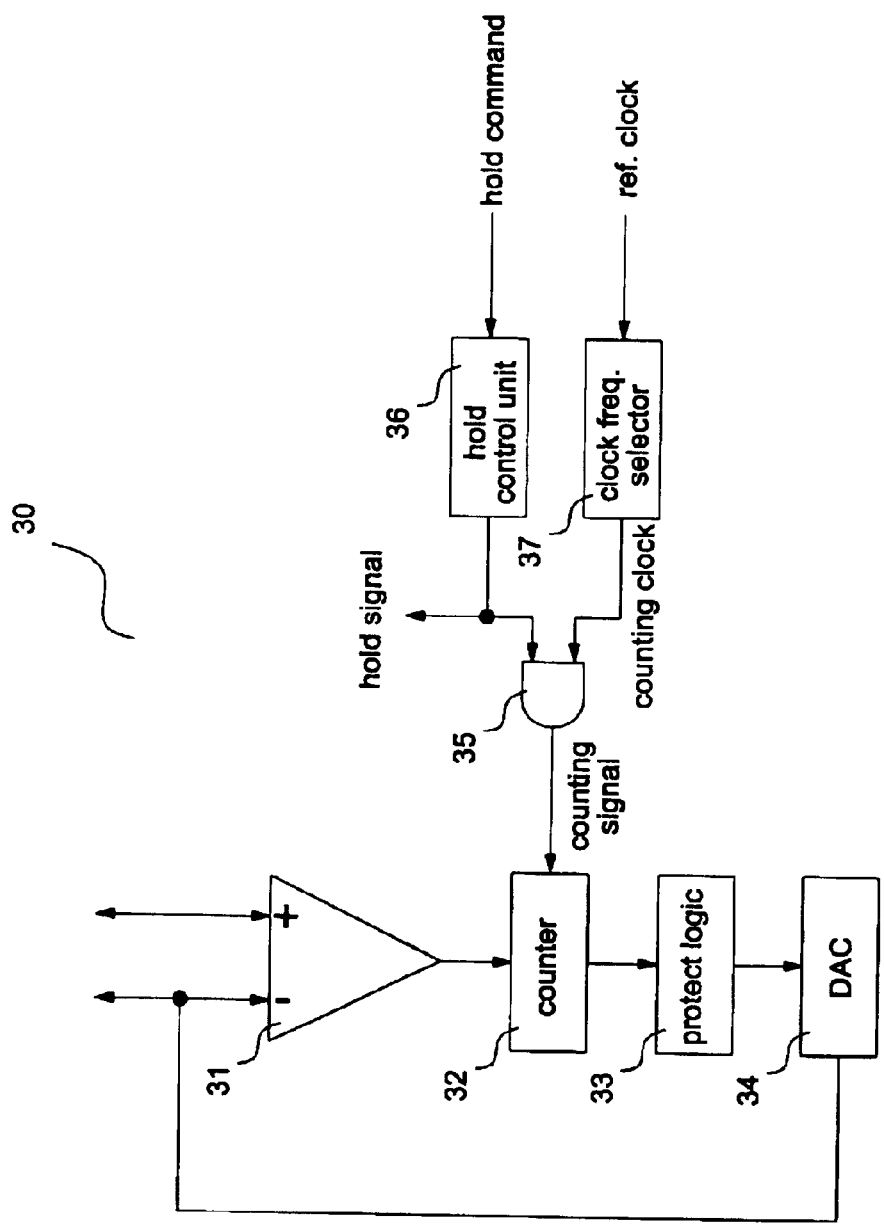
FIG. 3 shows a block diagram of a second loop of the AGC device of the present invention.

FIGS. 2 and 3 show block diagrams of the AGC device of the invention, wherein FIG. 2 shows a first control loop while FIG. 3 shows a second control loop. The first control loop 20 includes a variable gain amplifier (VGA) 11, a top detector 12, a bottom detector 13, a substractor 14, a target setting unit 15, a comparator 16, a charge pump 17, a capacitor 18, a programmable low pass filter (PLPF) 22, and a multiplexer 21. The first control loop 20 is substantially the same as that of the conventional AGC device 10 except for the difference residing in that the multiplexer 21 is used to choose a gain control voltage of the first loop or the second loop as the gain control voltage. Since the units such as the variable gain amplifier 11, a top detector 12, a bottom detector 13, a substractor 14, a target setting unit 15, a comparator 16, a charge pump 17, a capacitor 18, and the like of the first control loop 20 have the same functions as the prior art, detailed descriptions thereof will be omitted. The first control loop 20 utilizes the PLPF 22 to filter a first gain control voltage held by the capacitor 18.

Referring to FIG. 3, the second control loop 30 includes a comparator 31, an up/down counter 32, a protect logic 33, a digital-to-analog converter (DAC) 34, an AND gate 35, a hold control unit 36, and a clock frequency selector 37. The comparator 31 receives the output voltage from the PLPF 22 and the output voltage from the DAC 34, outputs HIGH when the output voltage of the PLPF 22 is higher than that of the DAC 34, and outputs LOW when the output voltage of the PLPF 22 is lower than that of the DAC 34. The counter 32 is an up/down counter for receiving the output signal of the comparator 31 and the counting signal of the AND gate 35. When the comparator 31 outputs HIGH, the counter 32 up-counts the pulse number of the counting signal; when the comparator 31 outputs LOW, the counter 32 down-counts the pulse number of the counting signal. When the hold signal is enabled, there is not any pulse in the counting signal and the count value of the counter 32 is held unchanged. The protect logic 33 receives the count value of the counter 32 and protects the count value from overflowing. For example, if the counter 32 is a 6-bit counter, when the count value is 111111 and the counter 32 still up-counts, the count value changes to 000000. Thus, the protect logic 33 will protect the count value. Of course, if the output range of the DAC is greater than the variation range of the gain control voltage Vc of the VGA 11 under different gain requirements, the protect logic 33 can be omitted. The DAC 34 receives the output value authenticated by the protect logic 33, converts it into the analog second AGC voltage, and then outputs the second AGC voltage to the comparator 31 and the multiplexer 21.

The hold control unit 36 receives a hold command of the system and controls the hold signal according to the hold command. That is, when the hold command is to hold the gain control voltage, the hold control unit 36 outputs LOW to enable the hold signal; and when the hold command is to immediately respond the gain control voltage, the hold control unit 36 outputs HIGH to disable the hold signal. The clock frequency selector 37 receives a reference clock and divides the frequency of the reference clock into the counting clock with desired frequency. The AND gate 35 receives the counting clock of the hold signal, outputs the counting clock when the hold signal is disabled, and outputs LOW to hold the result of the counter when the hold signal is enabled. Thus, when the hold signal is disabled, the counter 32 counts up or down according to the counting signal to make the output voltage of the DAC 34 almost equal to the output voltage (first gain control voltage) of the PLPF 22. On the other hand, when the hold signal is enabled, the value of the counter 32 is kept unchanged. Thus, the output voltage of the DAC 34 is also held constant so that the AGC voltage is held unchanged.

Figure 1:
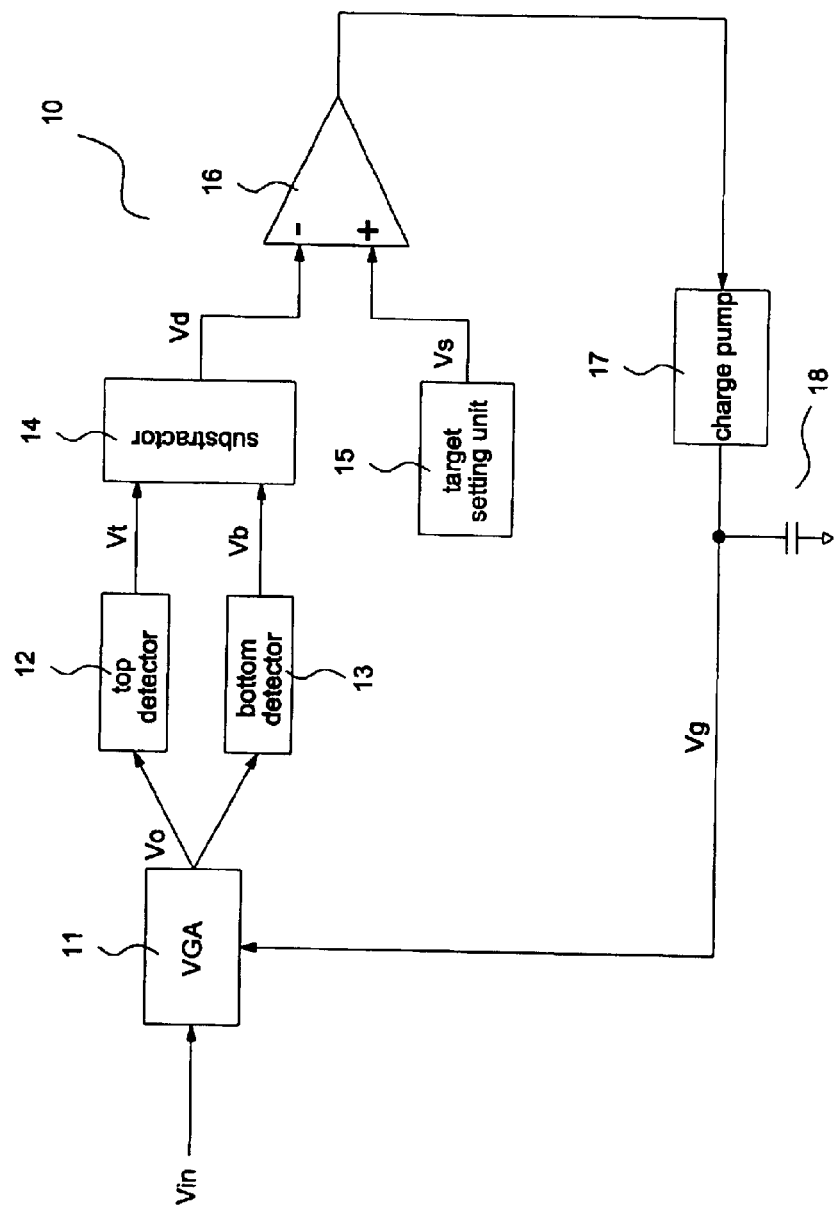
FIG. 1 shows a block diagram of a conventional AGC device.

When the hold signal is disabled, the multiplexer 21 outputs the first gain control voltage of the PLPF 22 to the VGA 11. Thus, the operation of the first control loop is the same as that of the conventional AGC device (FIG. 1) in this stage. When the hold signal is enabled, the multiplexer 21 outputs the second gain control voltage of the DAC 34 of second control loop 30 to the VGA 11. In this state, since the input value of the DAC 34 is held unchanged, the voltage output to the VGA 11 is held constant without dropping owing to the leakage current of the capacitor 18.

Figure 4:
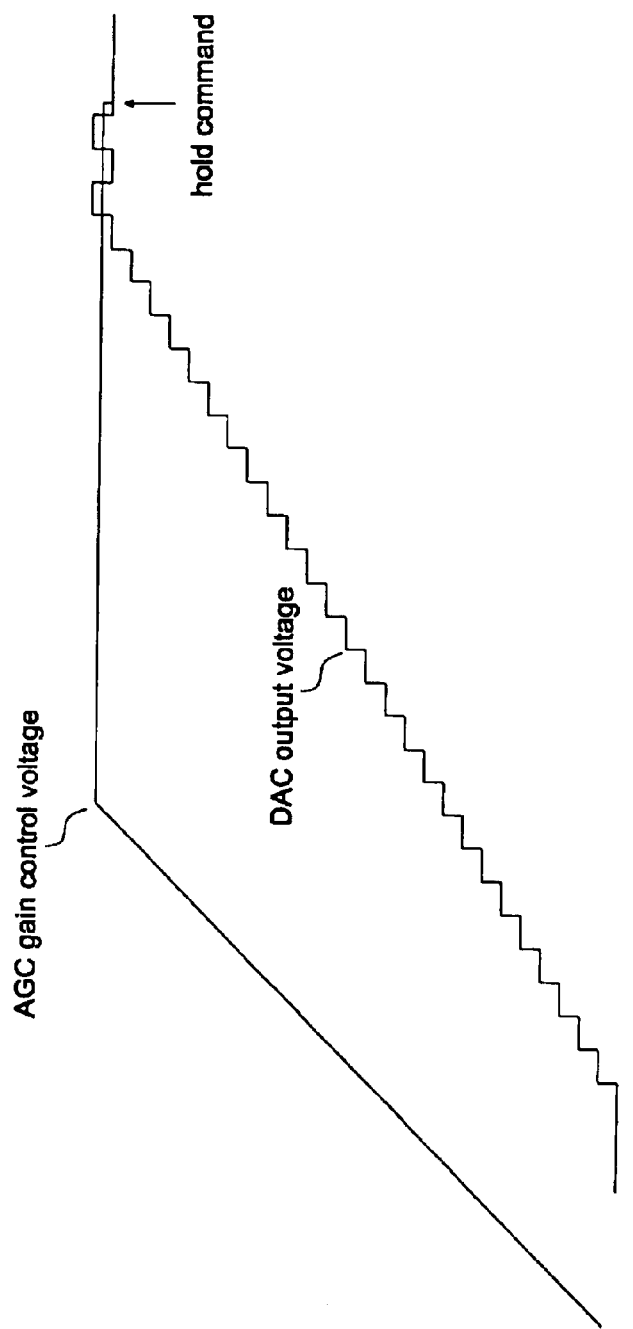
FIG. 4 is a schematic illustration showing a relationship between the DAC output voltage and the gain control voltage of the present invention.

FIG. 4 is a schematic illustration showing a relationship between the output voltage of the DAC 34 and the AGC voltage of the invention. As shown in the drawing, when the AGC device starts operating, the output voltage of the DAC 34 will follow the variation of the AGC voltage because the hold signal is disabled. At the beginning, the loop of the AGC is not stable yet. Then, the gain control voltage Vc of the AGC changes gradually until it converges at a stable voltage value. Under the control of the up/down counter of the second loop 30, the output voltage of the DAC 34 follows the variation of the voltage (gain control voltage) Vc output from the PLPF 22, and finally approaches to voltage Vc output from the PLPF 22. When the hold command is to hold the AGC voltage, the hold control unit 36 enables the hold signal and the counter 32 stops counting. Thus, the voltage of the DAC 34 is held constant. Meanwhile, the multiplexer 21 outputs the second gain control voltage of the DAC 34 to the VGA 11 in order to make the AGC voltage become the voltage of the DAC 34. Consequently, the AGC device of the invention can hold the AGC voltage for a long time.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. An automatic gain control device, comprising:

a first control loop for receiving an input voltage and generating a first AGC voltage;

a second control loop for receiving the first AGC voltage, registering the first AGC voltage in a digital format, and outputting a second AGC voltage; and a multiplexer for receiving the first AGC voltage and the second AGC voltage and choosing one of the voltages as an AGC voltage according to a hold signal.

2. The AGC device according to claim 1, wherein the first control loop comprises:

a variable gain amplifier for receiving the input voltage and amplifying the input voltage to generate an output voltage according to the AGC voltage of the multiplexer;

a top detector for receiving the output voltage and outputting a top voltage;

a bottom detector for receiving the output voltage and outputting a bottom voltage;

a substractor for receiving the top voltage and the bottom voltage and outputting a voltage difference between the top voltage and the bottom voltage;

a target setting unit for generating a target voltage;

a first comparator for receiving the voltage difference of the substractor and the target voltage of the target setting unit and generating a control signal;

a charge pump for receiving the control signal and generating the first AGC voltage; and a capacitor for receiving the first AGC voltage.

3. The AGC device according to claim 2, wherein the first control loop further comprises a programmable low-pass filter for filtering high-frequency noises of the first AGC voltage.

4. The AGC device according to claim 1, wherein the second control loop comprises:

a second comparator for receiving the first AGC voltage and the second AGC voltage and outputting a comparison signal;

an up/down counter for counting up or down the pulse number of a counting signal according to the comparison signal as an up/down control signal, and outputting a count value;

a digital-to-analog converter for converting the count value into the second AGC voltage;

a hold control unit for generating the hold signal according to a hold command; and a counting signal generator for receiving the hold signal, outputting the counting signal with predetermined frequency when the hold signal is disabled, and holding the counting signal at a constant level when the hold signal is enabled.

5. The AGC device according to claim 4, wherein the second control loop further comprises a count value protect logic for protecting the count value from overflowing.

6. The AGC device according to claim 2, wherein the second control loop comprises:

a second comparator for receiving the first AGC voltage and the second AGC voltage and outputting a comparison signal;

an up/down counter for counting up or down the pulse number of a counting signal according to the comparison signal as an up/down control signal, and outputting a count value;

a digital-to-analog converter for converting the count value into the second AGC voltage;

a hold control unit for generating the hold signal according to a hold command; and a counting signal generator for receiving the hold signal, outputting the counting signal with predetermined frequency when the hold signal is disabled, and holding the counting signal at a constant level when the hold signal is enabled.

7. The AGC device according to claim 4, wherein the second control loop further comprises a count value protect logic for protecting the count value from overflowing.

* * * * *